United States Patent
Rhoads

(10) Patent No.: US 6,731,515 B2
(45) Date of Patent: May 4, 2004

(54) RISER ASSEMBLY AND METHOD FOR COUPLING PERIPHERAL CARDS TO A MOTHERBOARD

(75) Inventor: Monte J. Rhoads, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,391

(22) Filed: Mar. 30, 2001

(65) Prior Publication Data

US 2002/0141170 A1 Oct. 3, 2002

(51) Int. Cl.[7] .............................. H05K 7/10; H05K 7/02; H05K 1/14; H01R 12/00
(52) U.S. Cl. ..................... 361/796; 361/785; 361/803; 361/788; 439/65
(58) Field of Search ................................. 361/796, 797, 361/798, 799, 800, 801, 802, 803, 807, 788, 785, 784, 790; 439/59, 60, 61, 62, 377, 65

(56) References Cited

U.S. PATENT DOCUMENTS

| | | | |
|---|---|---|---|
| 5,715,146 A | | 2/1998 | Hoppal |
| 5,754,796 A | * | 5/1998 | Wang et al. ................ 395/281 |
| 5,765,008 A | | 6/1998 | Desai et al. |
| 5,825,630 A | * | 10/1998 | Taylor et al. ................ 361/790 |
| 5,926,378 A | * | 7/1999 | DeWitt et al. ............... 361/788 |
| 5,943,215 A | | 8/1999 | Carney et al. |
| 6,004,139 A | * | 12/1999 | Dramstad et al. ............. 439/59 |
| 6,046,912 A | * | 4/2000 | Leman ........................ 361/784 |
| 6,147,871 A | | 11/2000 | DeWitt et al. |
| 6,155,842 A | * | 12/2000 | Baitz ........................... 439/61 |
| 6,273,730 B1 | * | 8/2001 | Chang ......................... 439/61 |

OTHER PUBLICATIONS

Intel Corporation, ATX Riser Card Specificaion version 1.0, copyright 1999, pp. 1–20.

* cited by examiner

Primary Examiner—David Martin
Assistant Examiner—Dameon E. Levi
(74) Attorney, Agent, or Firm—Blakely, Sokoloff, Taylor & Zafman LLP

(57) ABSTRACT

A riser card assembly for coupling two or more peripheral cards to a motherboard. The riser card assembly routes all necessary signal lines to each of the peripheral cards disposed thereon and, therefore, a customized motherboard is not required to achieve a small form factor. The riser card assembly includes a mounting portion and at least one routing portion. The mounting portion is secured in a card connector on the motherboard and includes a plurality of secondary card connectors, each secondary card connector for receiving a peripheral card. The mounting portion couples the signal lines at the card connector in which it is inserted to one of its secondary card connectors. The routing portion couples the signal lines from at least one adjacent card connector on the motherboard to the mounting portion, the mounting portion routing those signal lines to another one of its secondary card connectors.

58 Claims, 7 Drawing Sheets

RISER ASSEMBLY AND METHOD FOR COUPLING PERIPHERAL CARDS TO A MOTHERBOARD

FIELD OF THE INVENTION

The invention relates generally to computer systems and, more particularly, to a riser assembly for coupling peripheral cards to a circuit board.

BACKGROUND OF THE INVENTION

Computer systems, such as desktop computers, laptop computers, work stations, and servers, are well known in the art. These computer systems typically include a system board, or motherboard, secured within a chassis. Other components, such as a hard disk drive, floppy disk drive, CD ROM drive, one or more cooling fans, and a power supply, are also mounted within the chassis. A computer system may also include one or more built-in peripheral devices, including a keyboard, mouse, video display, and both serial and parallel ports.

A typical motherboard comprises a large printed circuit board having a number of components mounted thereon, including a processor coupled to a host or local bus, a chip set, system memory (e.g., SDRAM) coupled to a memory bus, and a Peripheral Component Interconnect (PCI) bus. See, e.g., *PCI Local Bus Specification*, Revision 2.2, and *PCI-X Specification*, Revision 1.0a. The chip set bridges the PCI bus with the local bus and also bridges the PCI bus to each of an Industry Standard Architecture (ISA) bus and a Small Computer System Interface (SCSI) bus, if present. See, e.g., SCSI-3. The chip set may also provide a system memory controller and bridge the memory bus to the local bus (as well as to the PCI bus). In addition, a motherboard typically includes input/output (I/O) connectors, floppy disk and hard disk drive connections, as well as circuitry for controlling any built-in peripheral devices—e.g., hard disk drives, floppy disk drives, and CD ROM drives, as noted above.

Generally, one or more card connectors (also referred to as card slots or card sockets) are located on a motherboard, each card connector for receiving a peripheral card. A peripheral card (also referred to as an expansion card, expansion board, or daughterboard) is added to a computer system to enhance that system's capabilities. For example, a peripheral card may provide a network interface, enhanced audio capability, or enhanced graphics. A peripheral card, as well as the card connector into which it is inserted for coupling to the motherboard, is typically PCI compatible or ISA compatible, such that the peripheral card (and connector) can be coupled to the PCI bus or ISA bus, respectively. Those of ordinary skill in the art will appreciate that peripheral cards and connectors may be manufactured or configured to meet other well known standards.

The PCI specification defines the PCI bus and a corresponding bus transfer protocol for interconnecting with any "PCI devices." As used herein, the term "PCI device" refers to any PCI compatible device, hardware, or component. Included in the PCI bus—or integrated into the chipset—is a bus arbitrator for evaluating pending requests by PCI devices for access to the PCI bus. Every PCI device (and the card connector coupling that device to the motherboard and, hence, to the PCI bus) includes a pair of arbitration lines connecting it directly to the bus arbitrator—a request (REQ#) line and a grant (GNT#) line. When a PCI device requires use of the PCI bus for a transaction (e.g., a data transfer), that device asserts a REQ# signal on its request line. When the bus arbitrator has determined that the requesting PCI device should be granted control of the PCI bus, it asserts a device-specific GNT# signal on the grant line of the requesting device. Any transactions conducted across the PCI bus, including bus arbitration, are generally synchronized to a PCI clock (PCI CLK) signal. During a transaction performed by a PCI device, the PCI device may assert or receive a number of other signals, including address and data signals, interrupt requests, and transaction control signals. Thus, every PCI device must be coupled (via its corresponding card connector or other interface) to the PCI bus by a plurality of signal lines.

The manufacture of motherboards is highly standardized, and a motherboard may be fabricated according to any one of a number of common specifications. For example, a motherboard may be manufactured in accordance with the ATX specification (see *ATX Motherboard Specification*, Release 2.03, December 1998), the microATX specification (see *microATX Motherboard Interface Specification*, Version 1.0, December 1997), or the NLX specification (see *NLX Motherboard Specification*, Release 1.8, April 1999), as well as other specifications. Motherboards meeting one of these specifications are readily available in the market. Customized motherboard configurations are generally available; however, non-standard board layouts are less preferred due to higher production costs.

There is presently an increasing demand—in applications such as rack mounted servers and portable computers—for computer systems and chassis exhibiting a low profile or small "form factor." As used herein, the term "form factor" refers generally to a height or thickness of a computer system or chassis relative to its lateral dimensions. Thus, depending on its orientation within a chassis, the "form factor" of a motherboard may be its relative height dimension as measured transverse to the plane of the motherboard. To satisfy the demand for such low profile computer systems, manufacturers must provide motherboard assemblies exhibiting a small form factor and adapted for mounting in a small form factor chassis. However, card connectors are typically mounted to a motherboard such that a peripheral card inserted into the card connector is oriented transverse to the plane of the motherboard. When installed, a peripheral card can extend a relatively great distance above a motherboard, making the motherboard assembly incompatible with a small form factor chassis.

To adapt a motherboard assembly having a plurality of peripheral cards coupled thereto—at least some of which peripheral cards violate the form factor of the intended chassis—it is known in the art to use a riser card. A typical riser card comprises a low profile circuit board adapted for insertion into a card connector on the motherboard and having a plurality (e.g., three) of secondary card connectors mounted thereon, each of these secondary card connectors providing a point of insertion for mounting a peripheral card parallel to the plane of the motherboard. Such a riser card assembly can provide a low profile motherboard assembly capable of fitting within a small form factor chassis; however, additional conductors or other communication paths must be routed to the card connector that receives the riser card to provide signal lines (e.g., the REQ#, GNT#, and PCI CLK signals, as well as others) for any peripheral cards in excess of one. Thus, a customized motherboard must be designed and manufactured to accommodate the riser card and requisite signal lines and, as noted above, such customized motherboards increase manufacturing costs.

DETAILED DESCRIPTION OF THE INVENTION

Embodiments of a riser card assembly and method providing a small form factor coupling between a plurality of peripheral cards and a motherboard will now be explained in detail. The embodiments of a riser card assembly and method described herein are illustrated in the context of coupling PCI compatible peripheral cards, or PCI devices, to a standard motherboard, such as an ATX motherboard. However, the following detailed description is only exemplary and is presented without limitation, and those of ordinary skill in the art will understand that the present invention is applicable to coupling any type of peripheral card to any motherboard configuration—or, generally, to any circuit board—irrespective of the particular architecture or specifications employed.

Figure 1:
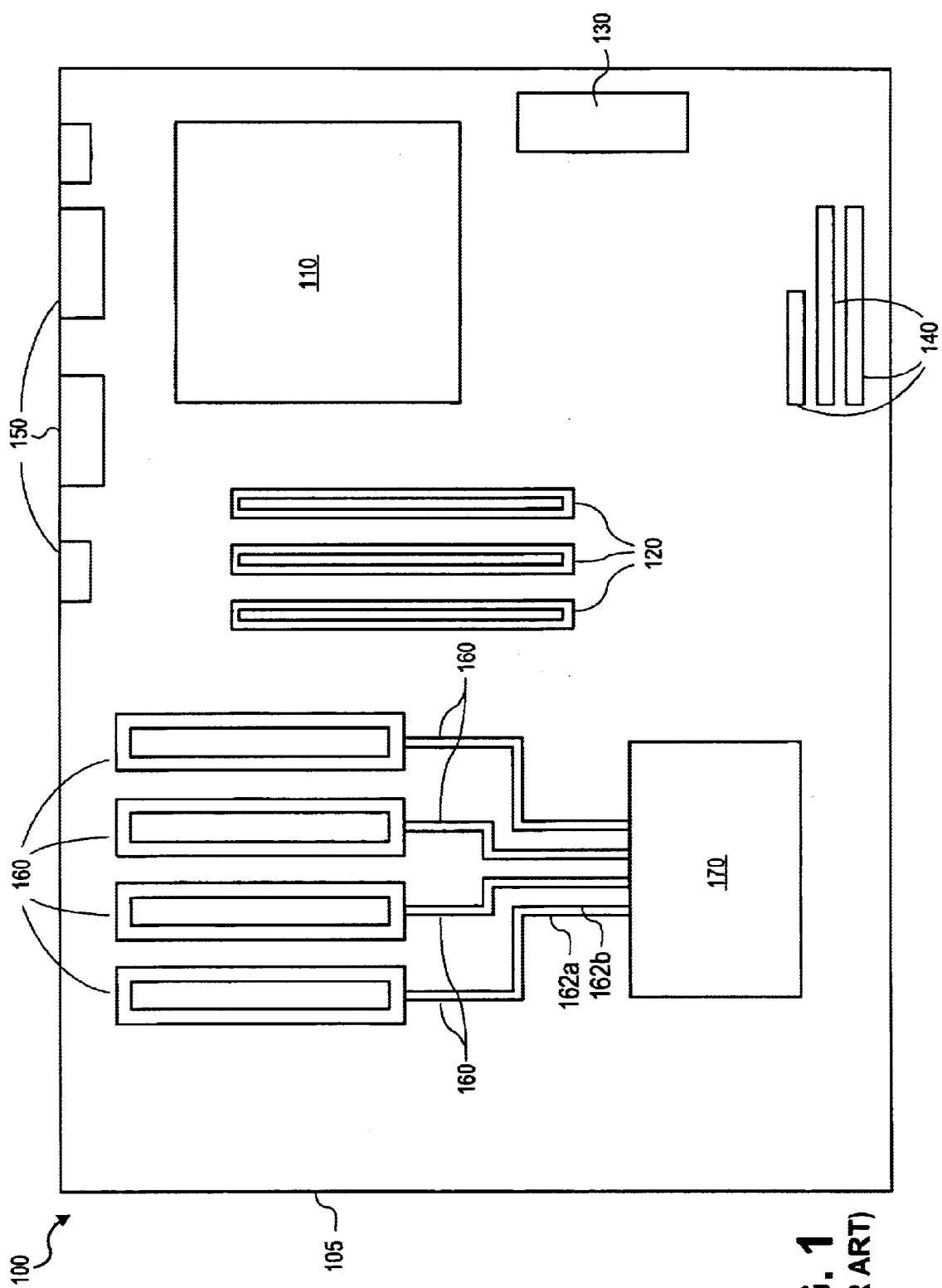
FIG. 1 shows a plan view of an exemplary embodiment of a conventional motherboard assembly.
Figure 2:
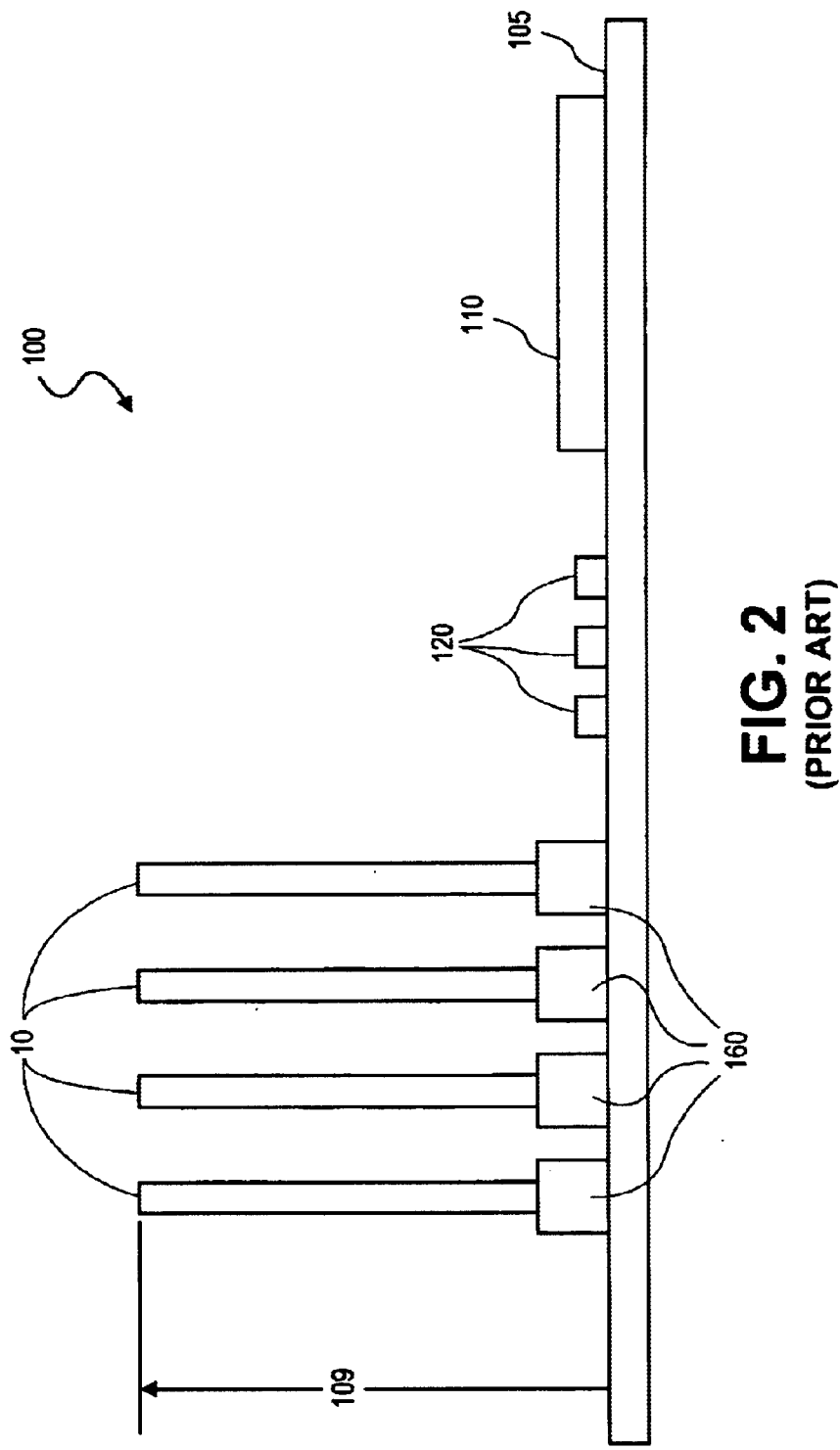
FIG. 2 shows an elevation view of the conventional motherboard assembly illustrated in FIG. 1.

A conventional motherboard assembly 100 is shown in FIGS. 1 and 2. The motherboard assembly 100 includes a motherboard 105 comprised of, for example, a circuit board material having a plurality of circuit traces or other signal lines formed thereon. The motherboard 105 may comprise an ATX compatible motherboard, or a motherboard built in accordance with any other suitable specification. Mounted on the motherboard 105 is a processor 110, which may comprise any processor known in the art. A plurality of memory slots 120, each for receiving a memory module (e.g. an SDRAM module), are also mounted on the motherboard 105. A power connector 130 couples the motherboard 105 to a power supply (not shown) to provide power to the devices and components mounted thereon. A plurality of floppy disk and hard disk drive connectors 140 are provided on the motherboard 105 to couple these peripheral devices with the motherboard 105. The motherboard 105 may also include one or more I/O ports 150. For clarity, the power connector 130, floppy disk and hard disk drive connectors 140, and I/O ports 150 are omitted from FIG. 2.

Mounted on motherboard 105 are a plurality of PCI compatible card connectors 160, each card connector 160 adapted to receive a PCI compatible peripheral card 10. By way of example, as shown in FIG. 2, each of the card connectors 160 may have a peripheral card 10 inserted therein and coupled to the motherboard 105. Each of the card connectors 160 is coupled via a plurality of signal lines 162 to a chip set 170. The signal lines 162 enable signals, such as the REQ#, GNT#, and PCI CLK signals, as well as interrupt requests, address and data signals, and transaction control signals, to be communicated between the chip set 170 and the peripheral cards 10. For example, at least a REQ# line 162a and a GNT# line 162b may couple each of the card connectors 160—and the peripheral card 10 inserted therein—to the chip set 170.

Referring to FIG. 2, the peripheral cards 10, when inserted into their mating card connector 160, are oriented substantially transverse to the motherboard 105 and extend above the upper surface of motherboard 105 to a height 109. Although all of the peripheral cards 10 illustrated in FIG. 2 extend to substantially the same height 109, those of ordinary skill in the art will appreciate that, in practice, all of the peripheral cards mounted on a motherboard may not be of equal dimensions. The transverse height 109 of the peripheral cards 10 above the motherboard 105 is relatively large (in comparison to the lateral dimensions of the motherboard 105), and the motherboard 105 exhibits a form factor incompatible with the small chassis form factors required for many current and future computer systems.

Figure 3:
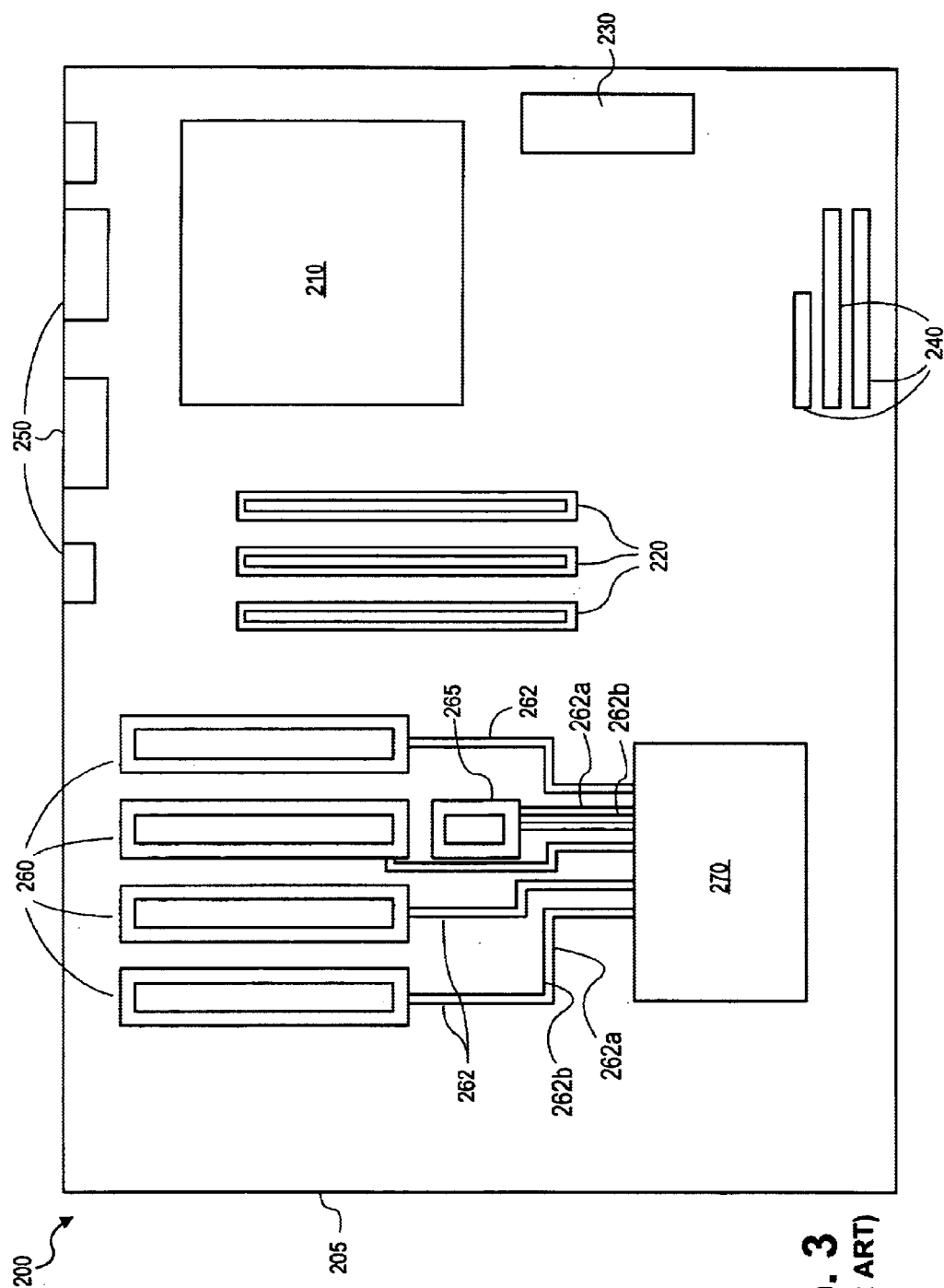
FIG. 3 shows a plan view of another exemplary embodiment of a conventional motherboard assembly.
Figure 4:
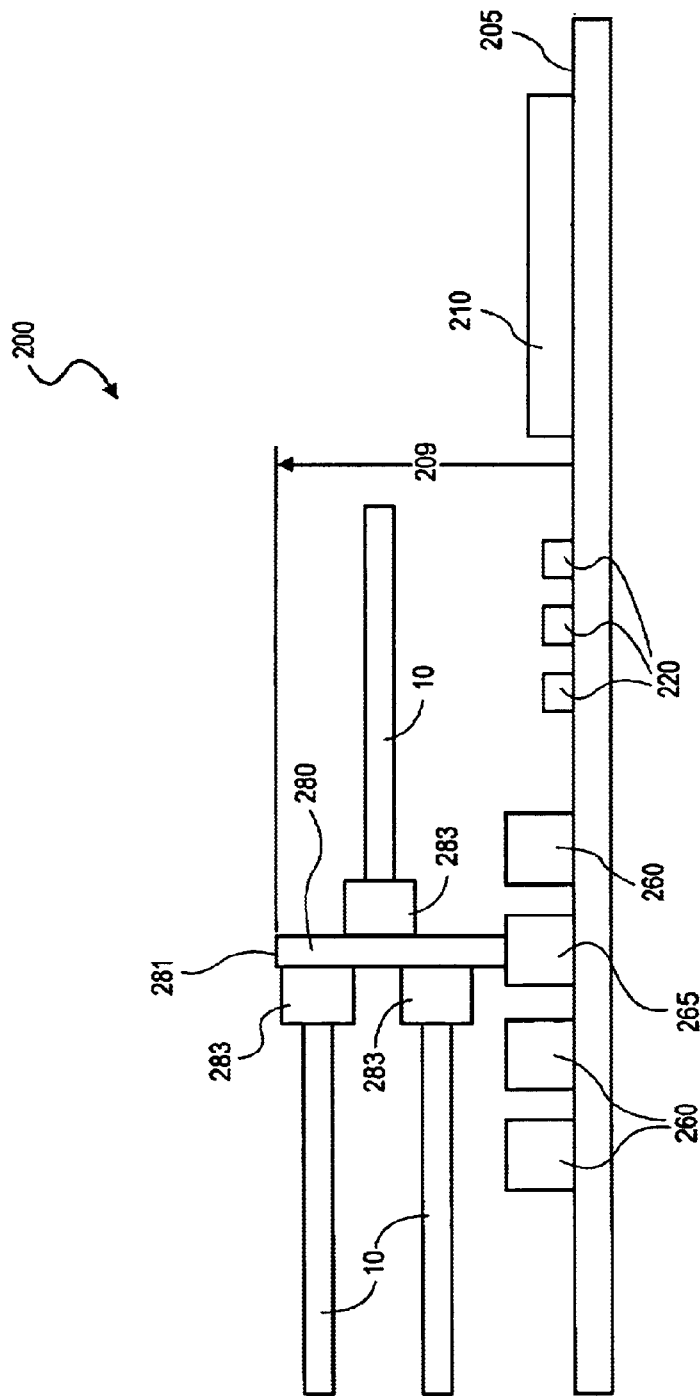
FIG. 4 shows an elevation view of the conventional motherboard assembly illustrated in FIG. 3.

To overcome the large form factor exhibited by conventional motherboard assemblies, such as the motherboard assembly 100 shown in FIGS. 1 and 2, it is known to couple peripheral cards to a motherboard user a riser card. Such a motherboard having a riser card is illustrated in FIGS. 3 and 4. Referring to these figures, a motherboard assembly 200 includes a motherboard 205 comprised of, for example, a circuit board material having a plurality of circuit traces or other signal lines formed thereon. The motherboard 205 may comprise an ATX compatible motherboard, or a motherboard configured according to any other suitable specification. Mounted on the motherboard 205 is a processor 210, which may comprise any processor known in the art. A plurality of memory slots 220, each for receiving a memory module (e.g. an SDRAM module), are also mounted on the motherboard 205. A power connector 230 couples the motherboard 205 to a power supply (not shown) to provide power to the devices and components mounted thereon. A plurality of floppy disk and hard disk drive connectors 240 are provided on the motherboard 205 to couple these peripheral devices with the motherboard 205. The motherboard 205 may also include one or more I/O ports 250. For clarity, the power connector 230, floppy disk and hard disk drive connectors 240, and I/O ports 250 are omitted from FIG. 4.

Mounted on motherboard 205 are one or more PCI compatible card connectors 260, each card connector 260 adapted to receive a PCI compatible peripheral card 10. Each of the card connectors 260 is coupled via a plurality of signal lines 262 to a chip set 270. The signal lines 262 enable signals, such as the REQ#, GNT#, and PCI CLK signals, as well as interrupt requests, address and data signals, and transaction control signals, to be communicated between the chip set 270 and any peripheral cards 10 inserted in card connectors 260. For example, at least a REQ# line 262a and a GNT# line 262b may couple each of the card connectors 260—and any peripheral card 10 inserted therein—to the chip set 270.

Each of the card connectors 260 may receive a peripheral card 10 in a manner similar to the motherboard assembly 100 illustrated in FIGS. 1 and 2. Alternatively, as shown in FIG. 4, at least one card connector 260 may have a riser card 280 inserted therein and oriented substantially transverse to motherboard 205. The riser card 280 comprises, for example, a circuit board having a plurality of secondary card connectors 283 mounted to its opposing surfaces. The secondary card connectors 283 are each adapted to receive a peripheral card 10 and to orient that peripheral card 10 substantially transverse to the riser card 280 and, hence, substantially parallel to the upper surface of the motherboard 205. Thus, the riser card assembly (i.e., riser card 280, secondary card connectors 283, and peripheral cards 10) extends above the upper surface of the motherboard 205 a height 209 substantially corresponding to the upper end 281 of the riser card 280. By appropriate dimensioning of riser card 280, the height 209 can be selected to provide a form factor that is significantly less than the form factor of the motherboard assembly 100 of FIGS. 1 and 2 and that is compatible with a small form factor chassis.

To achieve such a small form factor, however, the motherboard 205 and at least one of the card connectors 260 must be modified to receive the riser card 280. Specifically, the motherboard 205 and the card connector 260 receiving riser card 280 must be adapted to route communications between the chip set 270 and all peripheral cards 10 mounted to the riser card 280 through that card connector 260. By way of example, as illustrated in FIG. 3, a supplemental connector 265 may be associated with a card connector 260 to adapt that card connector 260 to receive a riser card 280. The supplemental connector 265 is coupled to the chip set 270 by a plurality of signal lines 262 enabling communication (e.g., REQ#, GNT#, and PCI CLK signals, as well as others) between the chip set 270 and any peripheral cards 10 in excess of one mounted on the riser card 280. For example, at least a REQ# line 262a and a GNT# line 262b may couple the supplemental connector 265—and any peripheral card 10 in excess of one mounted on the riser card 280—to the chip set 270.

In an alternative configuration (not shown), a motherboard may simply have a single card connector adapted to receive a riser card. In such a configuration, the motherboard and single card connector are adapted to route all signal lines between the chip set and peripheral cards (as well as the secondary card connectors on the riser card) through the single card connector.

Thus, as illustrated above, one can achieve a small form factor motherboard assembly using conventional riser cards. However, in order to provide the necessary signal lines between a chip set and any peripheral cards, these conventional riser cards require a specially adapted motherboard and card connector. As noted above, use of such customized motherboard configurations, although generally available, is undesirable due to the increased costs associated with the manufacture or acquisition of non-standard motherboards.

Figure 5:
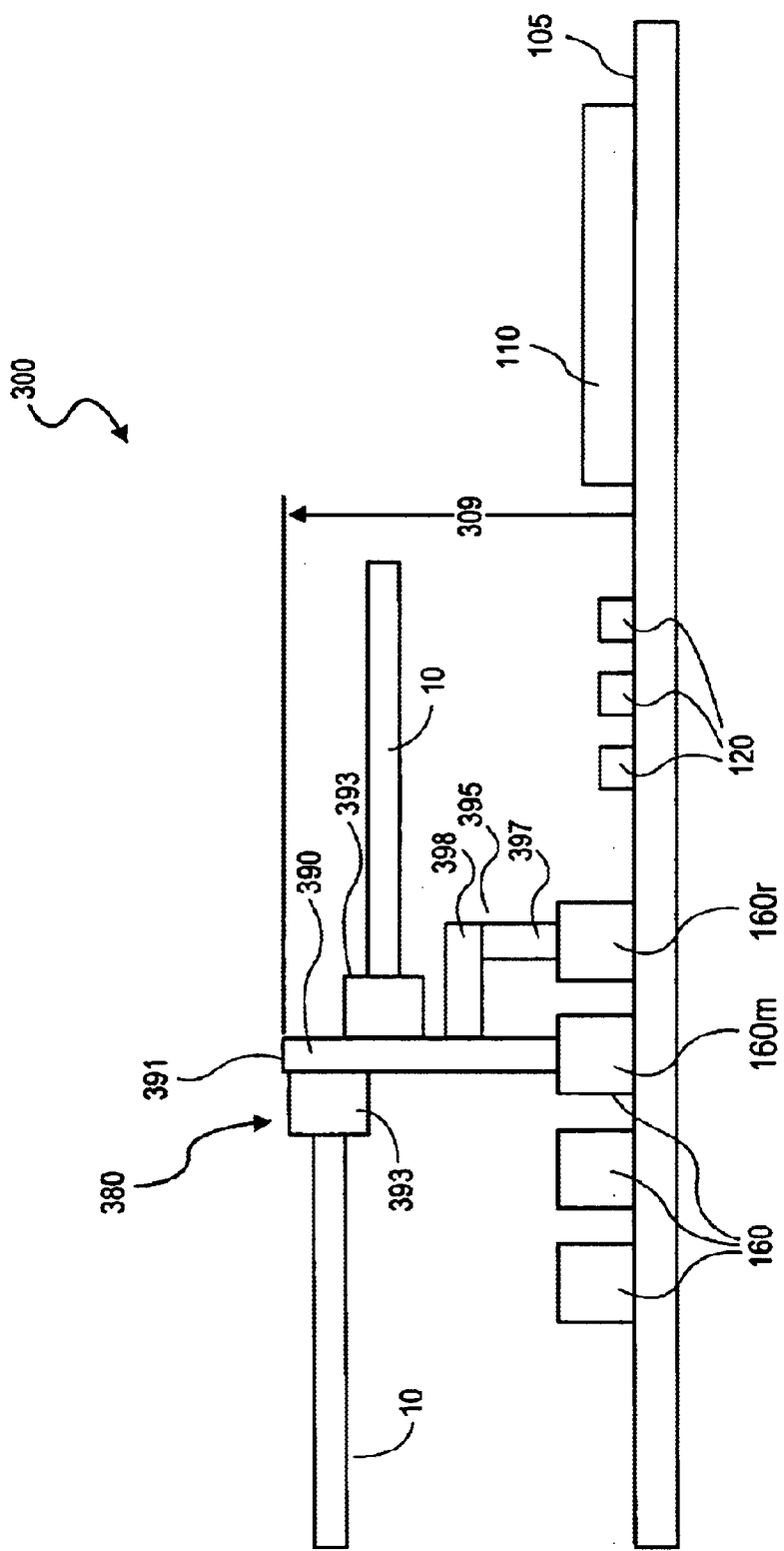
FIG. 5 shows an elevation view of a motherboard assembly including one embodiment of a riser card assembly according to the present invention.
Figure 6:
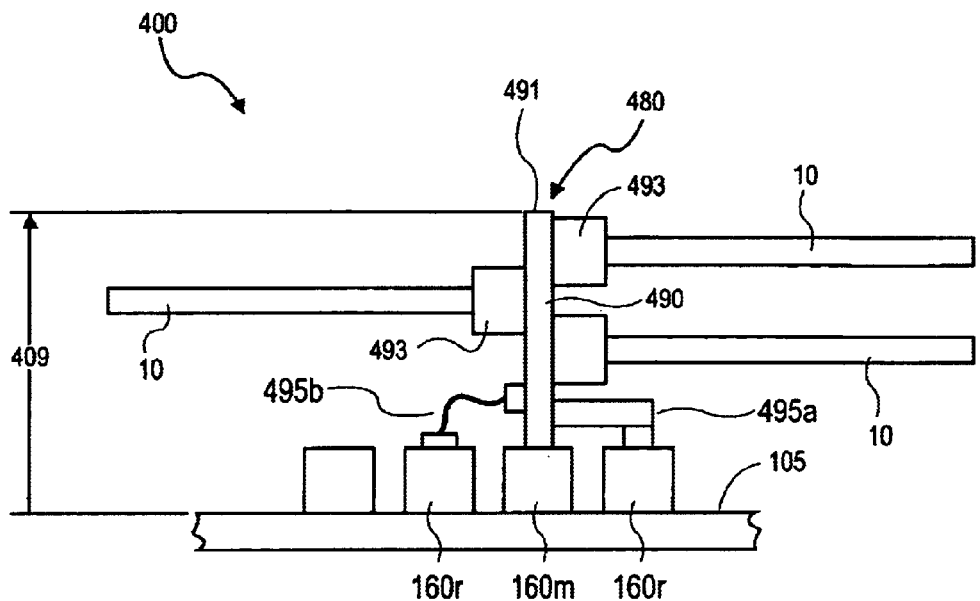
FIG. 6 shows a partial elevation view of a motherboard assembly including another embodiment of a riser card assembly according to the present invention.
Figure 7:
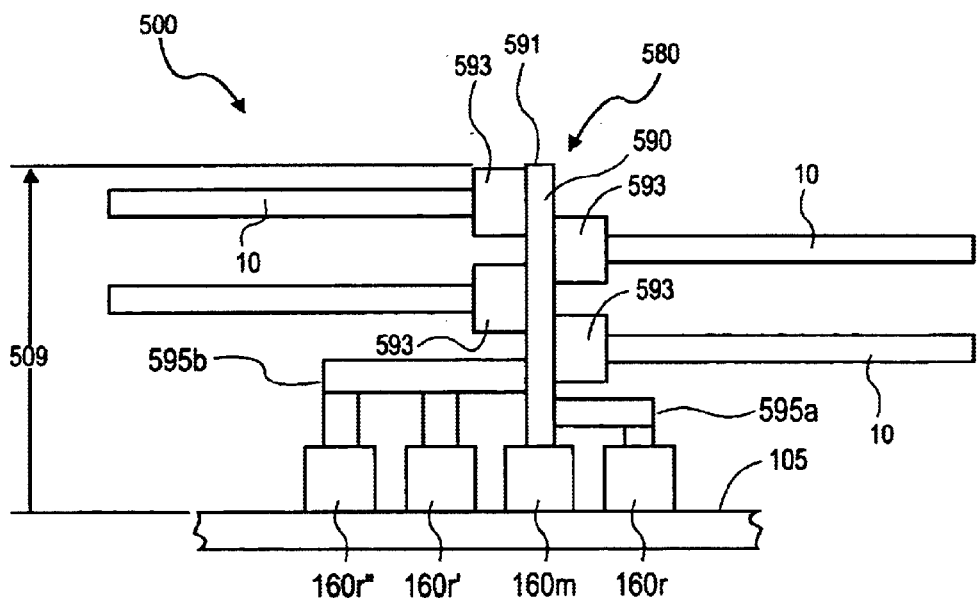
FIG. 7 shows a partial elevation view of a motherboard assembly including a further embodiment of a riser card assembly according to the present invention.

Shown in FIGS. 5 through 7 are various embodiments of a riser card assembly and method providing a small form factor coupling between a motherboard and a plurality of peripheral cards. Referring to FIG. 5, a motherboard assembly 300 includes a motherboard 105 having a processor 110 coupled thereto, as shown in FIGS. 1 and 2. Again, the motherboard 105 may comprise an ATX compatible motherboard, or a motherboard built according to any other suitable specification. The motherboard 105 also includes a plurality of memory slots 120, a power connector 130, a plurality of floppy disk and hard disk drive connectors 140, and one or more I/O ports 150 (the power connector 130, floppy disk and hard disk drive connectors 140, and I/O ports 150 being omitted from FIG. 5 for ease of understanding).

As noted above, the motherboard 105 includes a plurality of PCI compatible card connectors 160, each of the card connectors 160 adapted to receive a PCI compatible peripheral card 10. The card connectors 160 are each coupled via a plurality of signal lines 162 to a chip set 170 (see FIG. 1). The signal lines 162 enable signals, such as the REQ#, GNT#, and PCI CLK signals, as well as interrupt requests, address and data signals, and transaction control signals, to be communicated between the chip set 170 and any peripheral cards 10 mounted to the motherboard 105. At least a REQ# line 162a and a GNT# line 162b may couple each of the card connectors 160 to the chip set 170. A signal line 162 may comprise any communication path, whether electrical or optical, known in the art.

A riser card assembly 380 couples one or more peripheral cards 10 to the motherboard 105. The riser card assembly 380 comprises a mounting portion 390 and a routing portion 395. The mounting portion 390 is coupled to any one of the card connectors 160 on circuit board 105 and includes one or more secondary card connectors 393, each secondary card connector 393 for receiving a peripheral card 10 and orienting that peripheral card 10 relative to the motherboard 105 in a configuration providing a small form factor. By way of example, as illustrated in FIG. 5, the mounting portion 390 may comprise a substantially vertical riser card inserted into a card connector designated 160m and having two secondary card connectors 393 secured thereto—one secondary card connector 393 mounted on each of opposing sides of the vertical riser card. Each secondary card connector 393 is adapted to receive a peripheral card 10 and to orient that peripheral card 10 substantially parallel to the motherboard 105.

Although the card connectors 160 and secondary card connectors 393 may comprise different connectors, the separate designations of "card connector" and "secondary card connector" are used herein simply for ease of understanding. Those of ordinary skill in the art will understand that, in practice, a secondary card connector 393 on mounting portion 390 may be identical or similar to the card connectors 160 on motherboard 105. Thus, no unnecessary limitations should be inferred from the language or terms used to describe the card connectors 160, 393.

The mounting portion 390 includes circuitry or other communication paths to couple the signal lines 162 received at its mating card connector 160m to one of the secondary card connectors 393. Thus, one peripheral card 10 attached to mounting portion 390 will receive signals—i.e., REQ#, GNT#, PCI CLK, interrupt requests, address and data signals, and transaction control signals—from chip set 170 via the card connector 160m and mounting portion 390. For example, the mounting portion 390 may include circuitry to couple at least a REQ# line 162a and a GNT# line 162b from the card connector 160m to one peripheral card 10, as well as its mating secondary connector 393. All other peripheral cards 10 attached to mounting portion 390 are coupled to the chip set 170 via the routing portion 395, as will be explained in greater detail below.

It should be understood that the mounting portion 390 shown in FIG. 5 is only exemplary, and that the mounting portion 390 may be of any suitable structure or configuration adapted to provide a small form factor coupling of one or more peripheral cards 10 to motherboard 105. For example, the mounting portion 390 may comprise a structure that is oriented non-transverse to the motherboard 105 and/or that orients any attached peripheral cards 10 non-parallel to the motherboard 105. Also, although illustrated as a generally rectangular plate, the mounting portion 390 may comprise other alternative shapes. The mounting portion 390 may be comprised of any suitable material or combination of materials, including, for example, a circuit board material, a plastic material, or a composite material.

As noted above, the mounting portion 390 couples (via circuitry on mounting portion 390 and signal lines 162 at its mating card connector 160*m* ) only one peripheral card 10 to the chip set 170. The routing portion 395 routes all of the signal lines 162—or a selected portion thereof—coupled to an adjacent card connector 160*r* from that card connector 160*r* to the mounting portion 390. The routing portion 395 includes circuitry or other communication paths to couple the signal lines 162 received at its mating card connector 160*r* to corresponding communication paths on the mounting portion 390, the mounting portion 390, in turn, routing these corresponding communication paths to another one of the secondary card connectors 393 mounted thereon. Thus, a second peripheral card 10 may be attached to mounting portion 390, and this peripheral card will receive signals from chip set 170 via the card connector 160*r*, routing portion 395, and mounting portion 390. For example, the routing portion 395, as well as the mounting portion 390, may each include circuitry to couple at least a REQ# line 162*a* and a GNT# line 162*b* from the card connector 160*r* to the second peripheral card 10 and its mating secondary connector 393. It should be understood that the card connector 160*r* (receiving routing portion 395) and the card connector 160*m* (receiving mounting portion 390) do not necessarily lie directly adjacent to one another but, rather, may be separated by one or more intervening card connectors 160.

Routing portion 395 may comprise any suitable structure that routes the signal lines 162 from adjacent card connector 160*r* to the mounting portion 390. As shown in FIG. 5, the routing portion 395 may comprise a riser 397 inserted in card connector 160*r* coupled with another riser 398 that, in turn, is coupled to the mounting portion 390. The risers 397 and 398 may be of any suitable configuration and orientation. For example, the riser 397 may be oriented substantially transverse to the motherboard 105 and the riser 398 may be oriented substantially parallel to the motherboard 105. The risers 397 and 398 may each comprise a circuit board material, a plastic material, a composite material, or any other suitable material or combination of materials. Also, the risers 397 and 398 may comprise separate parts or, optionally, may be formed as a single, integrated part. In an alternative embodiment, the routing portion 395 comprises a cable or other flexible coupling—such as, for example, a flat ribbon cable—coupled between the mounting portion 390 and the adjacent card connector 160*r*.

The mounting portion 390 and routing portion 395 may comprise separate parts secured to one another by any suitable method coupling the communication paths in routing portion 395 to corresponding communication paths in the mounting portion 390. By way of example, any suitable connector or socket may provide both a mechanical and electrical (or optical) coupling between the routing portion 395 and the mounting portion 390. Alternatively, a rigid mechanical and electrical connection (e.g., solder) may secure the routing portion 395 to the mounting portion 390. In a further embodiment, the mounting portion 390 and routing portion 395 may comprise a single, integrated component.

The riser card assembly 380 orients any attached peripheral cards 10 relative to the motherboard 105 in a configuration providing a small form factor. For example, one or more peripheral cards 10 may be oriented substantially parallel to the motherboard 105 (see FIG. 5), such that the riser card assembly 380 extends to a height 309 above the upper surface of the motherboard 105. The height 309 essentially corresponds to the top 391 of the mounting portion 390. Thus, by appropriate dimensioning of the riser assembly 380, the height 309 can be selected to provide a low profile motherboard assembly 300 compatible with a small form factor chassis; however, because the riser card assembly 380 provides all necessary signal routing, a customized motherboard is not required to achieve a small form factor.

The riser card assembly 380 of FIG. 5 may be adapted to any suitable configuration. For example, in the embodiment shown in FIG. 6, a motherboard assembly 400 may include a riser card assembly 480 comprised of a mounting portion 490 and two routing portions 495*a*, 495*b*. As illustrated, the routing portion 495*b* comprises a flexible coupling, such as a flat ribbon cable. Accordingly, because the riser card assembly 480 includes two separate routing portion 495*a*, 495*b*, the riser card assembly 480 is capable of coupling three peripheral cards 10 to the motherboard 105.

Referring to FIG. 7, in another embodiment, a motherboard assembly 500 includes a riser card assembly 580 comprised of a mounting portion 590 and a first routing portion 595*a*. The first routing portion 595*a* couples the signal lines 162 leading to its mating connector 160*r* to the mounting portion 590. The riser card assembly 580 also includes a second, compound routing portion 595*b*. The compound routing portion 595*b* is inserted into two separate card connectors 160*r*', 160*r*" and couples the signal lines 162 from each of the two separate card connectors 160*r*', 160*r*" to the mounting portion 590. Thus, the riser card assembly 580 may couple four peripheral cards 10 to the motherboard 105. It should be understood that the card connectors 160*r*', 160*r*" may each be coupled to the mounting portion 590 by a separate routing portion.

Figure 8:
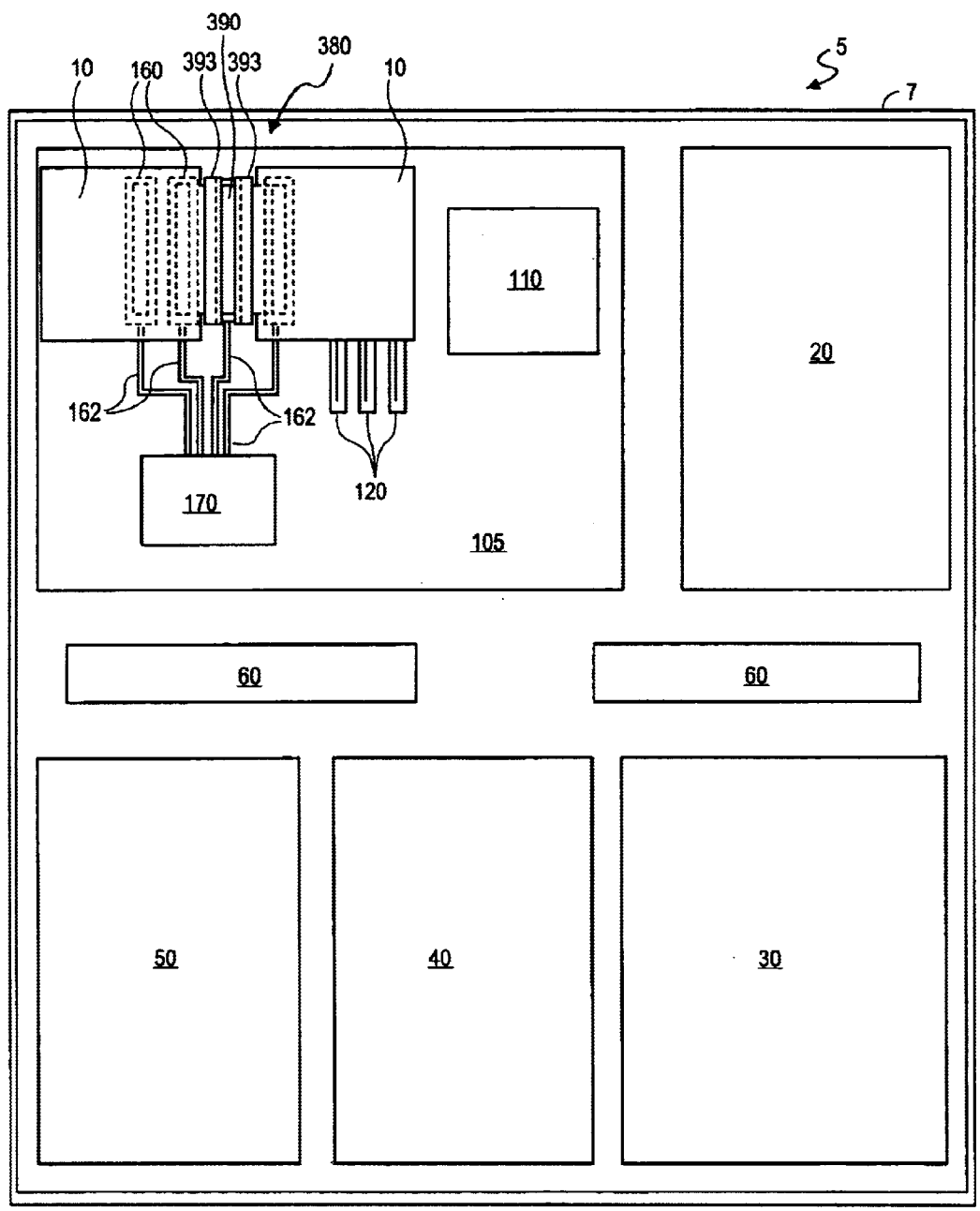
FIG. 8 shows a plan view of a computer system including a motherboard having a riser card assembly as illustrated in FIG. 5.

Referring now to FIG. 8, a computer system 5 includes a motherboard assembly 100 secured within a chassis 7, such as a small form factor chassis. The computer system includes a power supply 20 and one or more cooling fans 60. The computer system may also include one or more built-in peripherals. For example, one or more of a hard disk drive 30, a floppy disk drive 40, and a CD ROM drive 50 may be disposed within the chassis 7. The motherboard assembly 100 is similar to that described with respect to FIGS. 1 and 2 and includes a riser card assembly 380 as shown and described with respect to FIG. 5. Accordingly, the motherboard assembly 100 may include one or more peripheral cards 10 oriented in a small form factor configuration and disposed within chassis 7 (see also FIGS. 6 and 7). Also, the peripheral cards 10 coupled to motherboard 105 via riser card assembly 380 may be configured to align with access ports (not shown) in the chassis 7.

Riser card assemblies 380, 480, 580 providing a small form factor having been herein described, those of ordinary skill in the art will appreciate the advantages thereof. Two or more peripheral cards may be coupled to a motherboard— or, generally, to a circuit board—in a configuration providing a low profile. However, because the riser card assemblies 380, 480, 580 provide all necessary signal routing, a customized motherboard is not required to achieve a small form factor. Also, as illustrated in the exemplary embodiments of a riser card assembly 380, 480, 580 disclosed herein, a small form factor may be achieved using a broad array of signal routing and structural configurations.

The foregoing detailed description and accompanying drawings are only illustrative and not restrictive. They have been provided primarily for a clear and comprehensive understanding of the present invention and no unnecessary limitations are to be understood therefrom. Numerous additions, deletions, and modifications to the embodiments described herein, as well as alternative arrangements, may be devised by those skilled in the art without departing from the spirit of the present invention and the scope of the appended claims.

What is claimed is:

1. An apparatus comprising:
    a mounting portion to couple with a first card connector on a circuit board, the mounting portion including a first communication path to route at least one signal line from the first card connector on the circuit board to a first card connector on the mounting portion, the first card connector on the mounting portion for coupling with a peripheral card; and
    a routing portion to couple with a second card connector on the circuit board, the routing portion including a communication path, the communication path of the routing portion to route at least one signal line from the second card connector on the circuit board to the mounting portion, a second communication path of the mounting portion to route the at least one signal line of the second card connector on the circuit board to a second card connector on the mounting portion, the second card connector on the mounting portion for coupling with a peripheral card;
    wherein the first and second card connectors on the circuit board are each alternatively able to receive a peripheral card.

2. The apparatus of claim 1, the mounting portion and the routing portion comprising a single integrated component.

3. The apparatus of claim 1, further comprising at least one other routing portion to couple with a third card connector on the circuit board, the at least one other routing portion including a communication path to route at least one signal line from the third card connector on the circuit board to the mounting portion, a third communication path of the mounting portion to route the at least one signal line of the third card connector on the circuit board to a third card connector on the mounting portion.

4. The apparatus of claim 3, the routing portion and the at least one other routing portion comprising a compound routing portion.

5. The apparatus of claim 1, the routing portion comprising:
    a first riser for coupling with the second card connector on the circuit board; and
    a second riser coupled with the first riser, the second riser for coupling with the mounting portion.

6. The apparatus of claim 5, the first riser and the second riser comprising a single part.

7. The apparatus of claim 5, the first riser oriented substantially transverse to the circuit board and the second riser oriented substantially parallel to the circuit board.

8. The apparatus of claim 1, the routing portion comprising a flexible cable.

9. An apparatus comprising:
    a circuit board;
    a processor disposed on the circuit board;
    a chip set disposed on the circuit board and coupled to the processor;
    a first card connector disposed on the circuit board and coupled to the chip set by at least one signal line, the first card connector on the circuit board alternatively able to receive a peripheral card;
    a second card connector disposed on the circuit board and coupled to the chip set by at least one signal line, the second card connector on the circuit board alternatively able to receive a peripheral card;
    a mounting portion secured in the first card connector on the circuit board, the mounting portion including a first communication path to couple the at least one signal line of the first card connector on the circuit board to a first card connector disposed on the mounting portion, the first card connector on the mounting portion for coupling with a peripheral card; and
    a routing portion secured in the second card connector on the circuit board, the routing portion including a communication path to couple the at least one signal line of the second card connector on the circuit board to the mounting portion, a second communication path of the mounting portion to couple the at least one signal line of the second card connector on the circuit board to a second card connector disposed on the mounting portion, the second card connector on the mounting portion for coupling with a peripheral card.

10. The apparatus of claim 9, further comprising a peripheral card secured in one of the first card connector on the mounting portion and the second card connector on the mounting portion.

11. The apparatus of claim 10, the mounting portion to orient the peripheral card substantially parallel to the circuit board.

12. The apparatus of claim 9, each of the at least one signal line of the first card connector on the circuit board and the at least one signal line of the second card connector on the circuit board comprising at least a REQ# line and a GNT# line.

13. The apparatus of claim 9, the mounting portion and the routing portion comprising a single integrated component.

14. The apparatus of claim 9, further comprising:
    a third card connector disposed on the circuit board and coupled to the chip set by at least one signal line; and
    at least one other routing portion secured in the third card connector on the circuit board, the at least one other routing portion including a communication path to couple the at least one signal line of the third card connector on the circuit board to the mounting portion, a third communication path of the mounting portion to couple the at least one signal line of the third card connector on the circuit board to a third card connector disposed on the mounting portion.

15. The apparatus of claim 14, the routing portion and the at least one other routing portion comprising a compound routing portion.

16. The apparatus of claim 9, the routing portion comprising:
    a first riser coupled with the second card connector on the circuit board; and
    a second riser coupled with the first riser, the second riser coupled with the mounting portion.

17. The apparatus of claim 16, the first riser and the second riser comprising a single part.

18. The apparatus of claim 16, the first riser oriented substantially transverse to the circuit board and the second riser oriented substantially parallel to the circuit board.

19. The apparatus of claim 9, the routing portion comprising a flexible cable.

20. The apparatus of claim 9, the first card connector on the circuit board separated from the second card connector on the circuit board by at least one intervening card connector disposed on the circuit board.

21. An apparatus comprising:
    a chassis;

a circuit board disposed in the chassis;

a processor disposed on the circuit board;

a chip set disposed on the circuit board and coupled to the processor;

a first card connector disposed on the circuit board and coupled to the chip set by at least one signal line, the first card connector on the circuit board alternatively able to receive a peripheral card;

a second card connector disposed on the circuit board and coupled to the chip set by at least one signal line, the second card connector on the circuit board alternatively able to receive a peripheral card;

a mounting portion secured in the first card connector on the circuit board, the mounting portion including a first communication path to couple the at least one signal line of the first card connector on the circuit board to a first card connector disposed on the mounting portion, the first card connector on the mounting portion for coupling with a peripheral card; and a routing portion secured in the second card connector on the circuit board, the routing portion including a communication path to couple the at least one signal line of the second card connector on the circuit board to the mounting portion, a second communication path of the mounting portion to couple the at least one signal line of the second card connector on the circuit board to a second card connector disposed on the mounting portion, the second card connector on the mounting portion for coupling with a peripheral card.

22. The apparatus of claim 21, further comprising a peripheral card secured in one of the first card connector on the mounting portion and the second card connector on the mounting portion.

23. The apparatus of claim 22, the mounting portion to orient the peripheral card substantially parallel to the circuit board.

24. The apparatus of claim 21, each of the at least one signal line of the first card connector on the circuit board and the at least one signal line of the second card connector on the circuit board comprising at least a REQ# line and a GNT# line.

25. The apparatus of claim 21, the mounting portion and the routing portion comprising a single integrated component.

26. The apparatus of claim 21, further comprising:

a third card connector disposed on the circuit board and coupled to the chip set by at least one signal line; and at least one other routing portion secured in the third card connector on the circuit board, the at least one other routing portion including a communication path to couple the at least one signal line of the third card connector on the circuit board to the mounting portion, a third communication path of the mounting portion to couple the at least one signal line of the third card connector on the circuit board to a third card connector disposed on the mounting portion.

27. The apparatus of claim 26, the routing portion and the at least one other routing portion comprising a compound routing portion.

28. The apparatus of claim 21, the routing portion comprising:

a first riser coupled with the second card connector on the circuit board; and a second riser coupled with the first riser, the second riser coupled with the mounting portion.

29. The apparatus of claim 28, the first riser and the second riser comprising a single part.

30. The apparatus of claim 28, the first riser oriented substantially transverse to the circuit board and the second riser oriented substantially parallel to the circuit board.

31. The apparatus of claim 21, the routing portion comprising a flexible cable.

32. The apparatus of claim 21, the first card connector on the circuit board separated from the second card connector on the circuit board by at least one intervening card connector disposed on the circuit board.

33. An apparatus comprising:

first routing means to couple with a first card connector on a circuit board, the first routing means including a first communication means for routing at least one signal line from the first card connector on the circuit board to a first card connector disposed on the first routing means, the first card connector on the first routing means for coupling with a peripheral card; and second routing means to couple with a second card connector on the circuit board, the second routing means including a communication means, the communication means of the second routing means for routing at least one signal line from the second card connector on the circuit board to the first routing means, a second communication means of the first routing means to route the at least one signal line of the second card connector on the circuit board to a second card connector disposed on the first routing means, the second card connector on the first routing means for coupling with a peripheral card;

wherein the first and second card connectors on the circuit board are each alternatively able to receive a peripheral card.

34. The apparatus of claim 33, further comprising a third routing means to couple with a third card connector on the circuit board, the third routing means including a communication means for routing at least one signal line from the third card connector on the circuit board to the first routing means, a third communication means of the first routing means to route the at least one signal line of the third card connector on the circuit board to a third card connector disposed on the first routing means.

35. The apparatus of claim 33, each of the first and second communication means of the first routing means and the communication means of the second routing means to route one of an electrical signal and an optical signal.

36. A method comprising:

securing a mounting structure to a first card connector on a circuit board, the first card connector on the circuit board alternatively able to receive a peripheral card;

securing a routing structure to a second card connector on the circuit board, the second card connector on the circuit board alternatively able to receive a peripheral card;

routing at least one signal line from the first card connector on the circuit board through a first communication path of the mounting structure to a first card connector on the mounting structure, the first card connector on the mounting structure for coupling with a peripheral card;

routing at least one signal line from the second card connector on the circuit board through a communication path of the routing structure to the mounting structure; and routing the at least one signal line of the circuit board second card connector through a second communication path of the mounting structure to a second card connector on the mounting structure, the second card connector on the mounting structure for coupling with a peripheral card.

37. The method of claim 36, further comprising:

securing a second routing structure in a third card connector on the circuit board;

routing at least one signal line from the third card connector on the circuit board through a communication path of the second routing structure to the mounting structure; and routing the at least one signal line of the circuit board third card connector through a third communication path of the mounting structure to a third card connector on the mounting structure.

38. The method of claim 36, further comprising:

routing at least a REQ# line and a GNT# line from the first card connector on the circuit board to the first card connector on the mounting structure; and routing at least a REQ# line and a GNT# line from the second card connector on the circuit board to the second card connector on the mounting structure.

39. The method of claim 36, further comprising securing a peripheral card in one of the first card connector on the mounting structure and the second card connector on the mounting structure.

40. The apparatus of claim 1, wherein each of the first and second communication paths of the mounting portion and the communication path of the routing portion comprises an electrically conductive path.

41. The apparatus of claim 1, wherein each of the first and second communication paths of the mounting portion and the communication path of the routing portion comprises an optical path.

42. The apparatus of claim 9, wherein each of the first and second communication paths of the mounting portion and the communication path of the routing portion comprises an electrically conductive path.

43. The apparatus of claim 9, wherein each of the first and second communication paths of the mounting portion and the communication path of the routing portion comprises an optical path.

44. The apparatus of claim 21, wherein each of the first and second communication paths of the mounting portion and the communication path of the routing portion comprises an electrically conductive path.

45. The apparatus of claim 21, wherein each of the first and second communication paths of the mounting portion and the communication path of the routing portion comprises an optical path.

46. An apparatus comprising:

a circuit board;

a first card connector disposed on the circuit board and having at least one signal line extending therefrom, the first card connector on the circuit board alternatively able to receive a peripheral card;

a second card connector disposed on the circuit board and having at least one signal line extending therefrom, the second card connector on the circuit board alternatively able to receive a peripheral card;

a mounting portion secured in the first card connector on the circuit board, the mounting portion including a first communication path to couple the at least one signal line of the first card connector on the circuit board to a first card connector disposed on the mounting portion, the first card connector on the mounting portion for coupling with a peripheral card; and a routing portion secured in the second card connector on the circuit board, the routing portion including a communication path to couple the at least one signal line of the second card connector on the circuit board to the mounting portion, a second communication path of the mounting portion to couple the at least one signal line of the second card connector on the circuit board to a second card connector disposed on the mounting portion, the second card connector on the mounting portion for coupling with a peripheral card.

47. The apparatus of claim 46, further comprising a peripheral card secured in one of the first card connector on the mounting portion and the second card connector on the mounting portion.

48. The apparatus of claim 47, the mounting portion to orient the peripheral card substantially parallel to the circuit board.

49. The apparatus of claim 46, the mounting portion and the routing portion comprising a single integrated component.

50. The apparatus of claim 46, further comprising:

a third card connector disposed on the circuit board and having at least one signal line extending therefrom; and at least one other routing portion secured in the third card connector on the circuit board, the at least one other routing portion including a communication path to couple the at least one signal line of the third card connector on the circuit board to the mounting portion, a third communication path of the mounting portion to couple the at least one signal line of the third card connector on the circuit board to a third card connector disposed on the mounting portion.

51. The apparatus of claim 50, the routing portion and the at least one other routing portion comprising a compound routing portion.

52. The apparatus of claim 46, the routing portion comprising:

a first riser coupled with the second card connector on the circuit board; and a second riser coupled with the first riser, the second riser coupled with the mounting portion.

53. The apparatus of claim 52, the first riser and the second riser comprising a single part.

54. The apparatus of claim 52, the first riser oriented substantially transverse to the circuit board and the second riser oriented substantially parallel to the circuit board.

55. The apparatus of claim 46, the routing portion comprising a flexible cable.

56. The apparatus of claim 46, the first card connector on the circuit board separated from the second card connector on the circuit board by at least one intervening card connector disposed on the circuit board.

57. The apparatus of claim 46, wherein each of the first and second communication paths of the mounting portion and the communication path of the routing portion comprises an electrically conductive path.

58. The apparatus of claim 46, wherein each of the first and second communication paths of the mounting portion and the communication path of the routing portion comprises an optical path.

* * * * *